United States Patent [19]

Gray

[11] Patent Number: 5,051,729
[45] Date of Patent: Sep. 24, 1991

[54] PRESSURE RESPONSIVE ENCODER

[75] Inventor: Tommy L. Gray, Dallas, Tex.

[73] Assignee: Span Instruments, Inc., Plano, Tex.

[21] Appl. No.: 158,850

[22] Filed: Feb. 22, 1988

[51] Int. Cl.$^5$ ............................................. G08B 21/00
[52] U.S. Cl. .................................... 340/626; 340/688
[58] Field of Search ............... 340/626, 688; 250/227; 73/732, 733; 200/81.8

[56] References Cited

U.S. PATENT DOCUMENTS

| | | | |
|---|---|---|---|
| 2,265,149 | 12/1941 | Crane et al. | 250/231 R |
| 2,505,314 | 4/1950 | Wallace et al. | 340/870.14 |
| 3,286,529 | 11/1966 | Damrel, Jr. et al. | 73/418 |
| 3,301,062 | 1/1967 | Reesby et al. | 73/393 |
| 3,441,740 | 4/1969 | De Cloux et al. | 250/227 X |
| 3,513,708 | 5/1970 | Springer | 73/384 |
| 3,580,082 | 5/1971 | Strack | 455/614 X |
| 3,612,881 | 10/1971 | King | 250/204 |
| 3,742,233 | 6/1973 | Gorgens et al. | 250/231 R |
| 3,750,473 | 8/1973 | Bennett | 73/387 |
| 3,780,589 | 12/1973 | Fruit | 73/418 |
| 3,820,391 | 6/1974 | Baker et al. | 73/170 A |
| 3,867,680 | 2/1975 | King | 250/204 X |
| 3,906,223 | 9/1975 | White | 250/231 SE |
| 3,916,185 | 10/1975 | Jehly | 73/386 |
| 3,918,307 | 11/1975 | Hulle et al. | 73/384 |
| 3,953,847 | 4/1976 | Younkin et al. | 340/347 AD |
| 4,006,472 | 2/1977 | Greene | 250/231 R X |
| 4,086,488 | 4/1978 | Hill | 250/231 P |
| 4,086,580 | 4/1978 | Schroeder | 340/347 P |
| 4,214,155 | 7/1980 | Jones | 250/227 X |
| 4,499,649 | 2/1985 | Maxner | 250/227 X |
| 4,588,982 | 5/1986 | Goodwin | 340/688 X |
| 4,613,851 | 9/1986 | Hines | 340/688 |
| 4,631,529 | 12/1986 | Zeitz | 340/619 |
| 4,665,747 | 5/1987 | Muscatell | 73/386 |

Primary Examiner—Joseph A. Orsino
Assistant Examiner—Jeffery A. Hofsass
Attorney, Agent, or Firm—Harold E. Meier

[57] ABSTRACT

A pressure responsive apparatus having an encoded disc provides preselected pressure indication. The apparatus preferably includes a pressure gauge having a Bourdon tube responsive to an external pressure. The Bourdon tube drives a conventional pointer indicator which has mounted thereto the encoded disc. Light is transmitted to the disc by means of fiber optic cables from a remotely positioned oscillator. Light if reflected by the disc at the preselected pressures and transmitted by fiber optic cables to processing circuitry that responds to reflected light signals as generated by the oscillator. To generate these light signals, light emitting diodes form a light source and the light signals are detected by means of phototransistors. For apparatus detecting two preselected pressures, there is a light source/light detector pair for each pressure. The processing circuitry responding to the outputs of the phototransistors generates visual indications of the preselected pressures.

14 Claims, 3 Drawing Sheets

PRESSURE RESPONSIVE ENCODER

TECHNICAL FIELD

This invention relates to condition responsive devices and, more particularly, to a pressure monitoring apparatus incorporating an encoded disc, a light source and a light detector along with associate electronic circuitry for generating an indication of preset pressures or pressure differential.

BACKGROUND OF THE INVENTION

Condition responsive devices which provide an indication or control a selected operation in response thereto, are well known in the prior art. Such devices have been used in many diverse environments. For example, it is known in the prior art to connect a pressure sensitive element, such as a Bourdon tube, to a source of external pressure, whereby in operation the tube is deflected by an amount proportional to the sensed pressure variations. The mechanical deflection of the Bourdon tube is transduced into a mechanical output to provide an indication of the pressure in the tube or, alternatively, to control a physical operation. An apparatus of this type is shown in U.S. Pat. No. 4,502,334 and in U.S. Pat. No. 3,742,233, the latter describing a transducer for converting the motion of a Bourdon tube into a digital electrical signal.

Although such condition responsive devices have proven generally effective for indicating a condition or controlling an operation in response to a change in the condition, such devices may not be acceptable for providing the necessary degree of safety required in certain atmospheric conditions. For example, the use of the device such as described in U.S. Pat. No. 3,742,233 requires the installation of a light source at the pressure responsive element. This creates a condition for an electrically produced spark which in an explosive atmosphere would have disastrous results. In such applications where there is a potentially explosive environment, even a small electrically produced spark cannot be tolerated due to the potential of a disastrous explosion. Heretofore, compensation to minimize the potential of an explosion due to an electrically produced spark has required expensive and complicated instrumentation with its attendant high cost and potential unreliability.

Accordingly, an advantage of the present invention is to provide a condition responsive apparatus having an encoded mask associated with the pressure sensitive element operating in conjunction with a remote light source and a remote light detector coupled to the mask by means of fiber optic cables.

SUMMARY OF THE INVENTION

The present invention relates to an apparatus having a control member movable in response to a predetermined physical condition. In the preferred embodiment, the control member is a pressure sensitive element, such as a Bourdon tube, which expands in response to an externally applied pressure. This pressure sensitive element drives a mechanical mechanism that includes a rotating shaft to which is mounted an encoded mask in the shape of a disc that rotates with the shaft. Associated with the encoded mask is a light source and light detector, along with electronic circuitry responsive to light pulses received by the light detector.

According to one embodiment of the invention, an encoded disc is supported on the end of a shaft that rotates in response to the movement of a Bourdon tube that responds to pressure variations. This encoded disc is optically coupled to a light source and a light detector by means of first and second fiber optic cables. The first fiber optic cable transmits light from the light source to the rotating encoded disc and a second fiber optic cable transmits light reflected from the encoded disc to a control circuit. The control circuit is connected to the light detector and responds to the output thereof to generate an indication of a preset pressure applied to the pressure responsive device.

In operation, the light source transmits light through the first fiber optic cable to the encoded disc which is either absorbed thereby or reflected to the second fiber optic cable. The second fiber optic cable transmits the reflected light to the light detector which generates an output that is amplified and conditioned in the control circuit to actuate an indicator or control element.

In accordance with a more specific embodiment of the invention, there is provided a pressure responsive controller that is optically coupled to a pressure responsive device. A first light source/light detector pair and a second light source/light detector pair are remotely located from the pressure responsive device. A first fiber optic cable transmits light from the light source of the first pair to the pressure responsive device, and a second fiber optic cable transmits light reflected at the pressure device from the light source to the light detector of the first pair. In similar fashion, a third fiber optic cable transmits light from the light source of the second pair to the pressure responsive device, and a fourth fiber optic cable transmits light reflected at the pressure device from the light source to the light detector of the second pair. Connected to the light detector of the first pair is a first control circuit that responds to the output of the light detector to generate an indication of a first preset pressure applied to the pressure responsive device. Connected to the light detector of the second pair and responsive to the output thereof is a second control circuit for generating an indication of a second preset pressure applied to the pressure responsive device.

An extension of the invention as described in the previous paragraph includes three or more light source/light detector pairs to sense more than two pressure set points. Although the invention is described using a two light source/light detector pair embodiment, it should be understood that the invention is not so limited.

Accordingly, the condition responsive apparatus of the present invention overcomes several disadvantages associated with similar devices heretofore available; particularly, the failure of such prior art devices to enable the elimination of electrically generated sparks at the condition responsive apparatus by the remote location of a light source and a light detector. In the present invention, such operation is provided by means of an encoded disc and fiber optic cables for remotely mounting a light source and a light detector and associated circuitry for processing the output of the light detector to provide an indication of preset pressure conditions.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION

Figure 1:
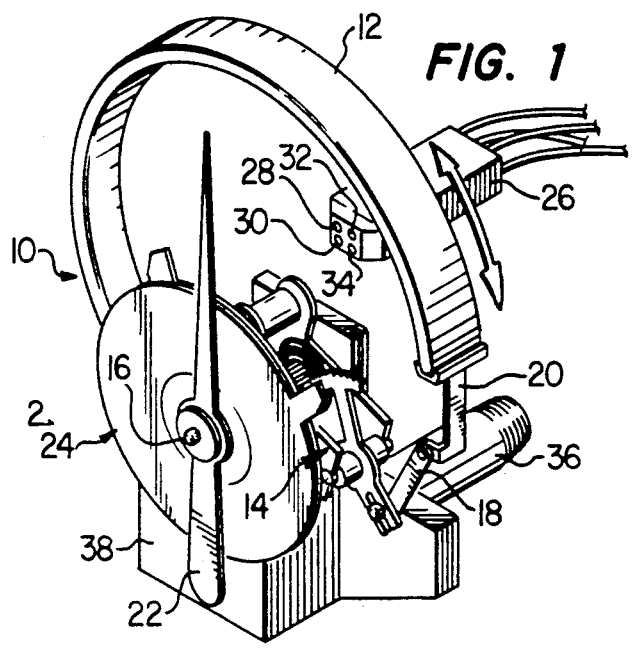
FIG. 1 is a perspective view of a Bourdon tube pressure responsive device driving a rotatable shaft supporting a pointer and an encoded disc.

Referring now to the drawings wherein like reference characters designate like or similar parts throughout the several views, FIG. 1 is a perspective view of a pressure gauge 10 of a condition responsive apparatus including a Bourdon tube 12 having the pressure responsive end connected to a gear assembly 14. The gear assembly 14 converts the motion of the Bourdon tube 12 into rotary motion as evidenced by movement of a shaft 16. The gear assembly 14 responds to movement of the Bourdon tube 12 by an interconnecting link 18 connected to an attaching bracket 20.

In accordance with conventional construction, the pressure gauge 10 includes a conduit 36 that communicates with the Bourdon tube 12 through a mounting block 38. Specifically, internal passages (not shown) within the mounting block 38 connect the conduit 36 to the Bourdon tube 12.

The gear assembly 14 is a conventional mechanism that drives the output shaft 16 and supports an indicating pointer 22. Mounted to rotate with the indicating pointer 22, is an encoded disc 24 having light absorbing and light reflecting surfaces as will be explained. The encoded disc 24 is positioned in the light path from a sensor head 26 that includes an array of four (4) fiber optic cables terminating flush with the face of the sensor head.

In operation, light from the fiber optic cables 28 and 30 is reflected or absorbed by the disc 24 to the fiber optic cables 32 and 34, respectively. To minimize to the extent possible any potential explosive spark being generated at the pressure gauge 10 all electrical current carrying components are removed from the location of the pressure gauge to a remote safe environment.

Figure 2:
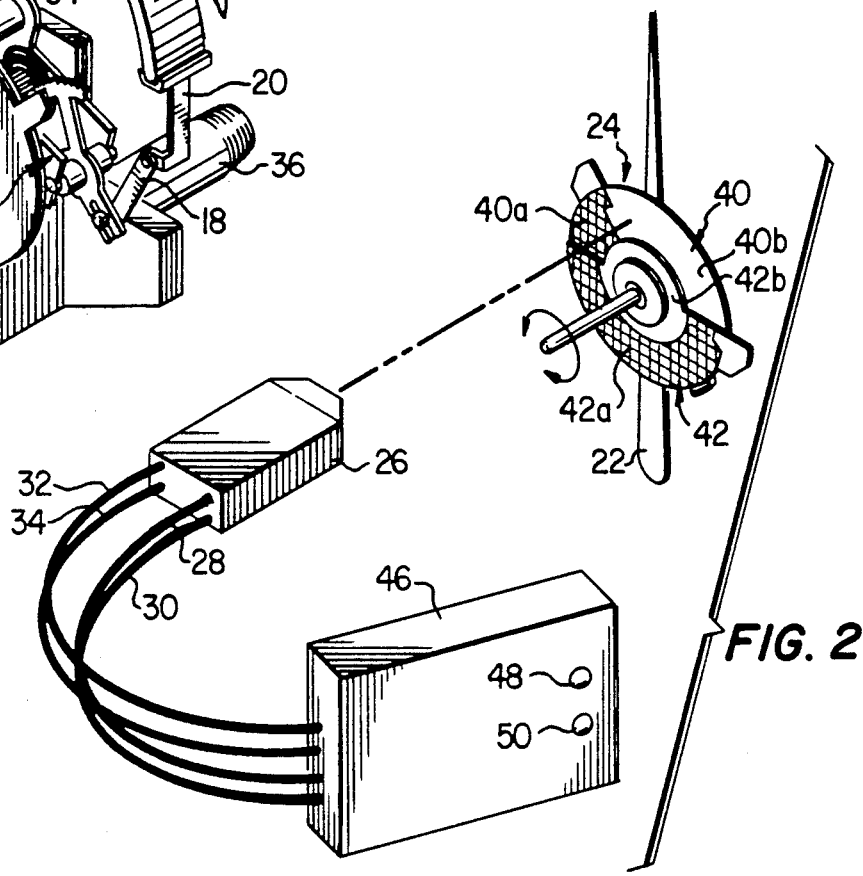
FIG. 2 is a perspective view of remote circuitry connected by means of fiber optic cables to the pressure responsive device of FIG. 1 with the ends of the fiber optic cables terminating at the encoded disc.
Figure 3:
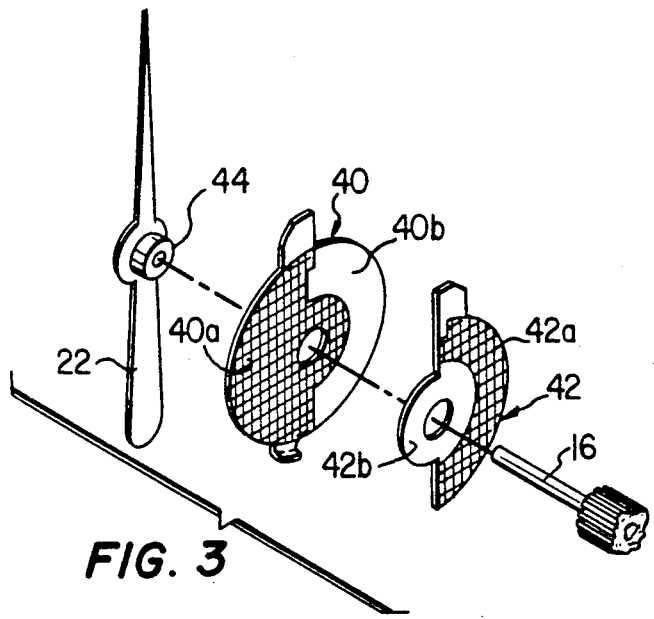
FIG. 3 is an exploded view of the rotating shaft of FIG. 1 along with a two component encoded disc and a pointer indicator.

Referring now to FIGS. 2 and 3, there is shown the encoded disc 24 comprising a circular member 40 and a semicircular member 42. The members 40 and 42 are mounted to rotate together by means of a hub 44 on the shaft 16. The mounting of the member 40 and the member 42 on the hub 44 is by means of a friction engagement with the hub such that the members 40 and 42 may be rotated with reference to each other. It is this rotation of the members 40 and 42 with reference to each other and with reference to the shaft 16 that establishes the first preselected pressure and the second preselected pressure as will be explained.

Referring to the circular member 40, the entire surface area 40b except for the surface area 40a is a reflective material. That is, light from either the fiber optic cable 28 or the fiber optic cable 30 will be reflected by the member 40 unless it falls on the surface area 40a which is a light absorbing material. Similarly, the member 42, includes a light absorbing surface area 42a and a light reflecting surface area 42b. Light from either the fiber optic cable 28 or the fiber optic cable 30 will be absorbed by the area 42a and reflected by the area 42b.

In operation of the encoded disc 24, light is projected from the ends of the fiber optic cables 28 and 30 to the encoded disc 24. The positioning of the sensor head 26 with reference to the encoded disc 24 is such that light transmitted from the fiber optic cable 28 will strike the members 40 and 42 and light projected from the fiber optic cable 30 will also strike the members 40 and 42. Thus, as illustrated in FIG. 2 light from the fiber optic cables 28 and 30 will be projected onto the members 40 and 42.

Figure 4:
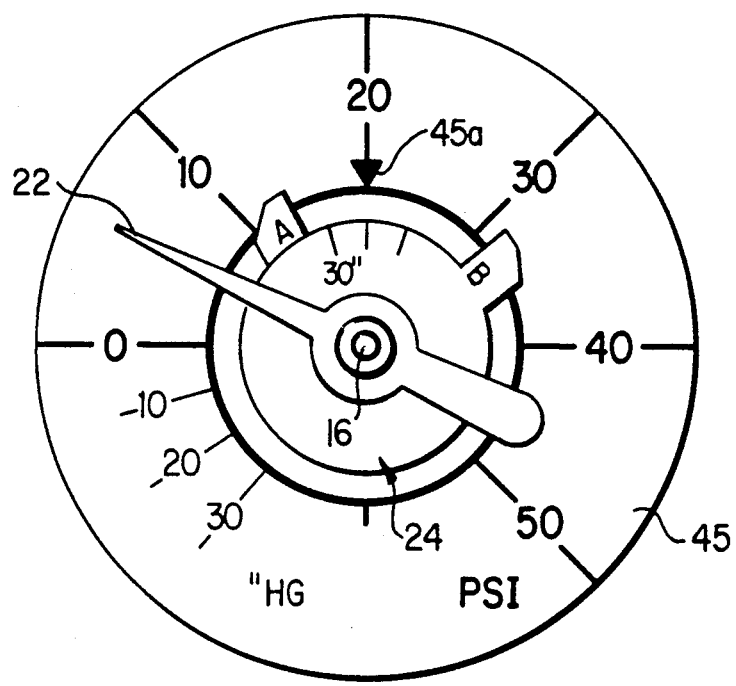
FIG. 4 is a front view of one example of a dial indicator with a two set point encoded disc.

Referring to FIG. 4, there is shown a front view of the encoded disc 24 including the members 40 and 42 mounted to the shaft 16. The encoded disc 24 with the members 40 and 42 are illustrated in relationship to a typical dial indicator 45 for a pressure responsive gauge that varies between 30 inches of mercury and 50 psi. As illustrated, the indicating pointer 22 is shown as approximately the 5 psi position.

On the face of the member 42, there is marked graduations indicating inches of mercury. To set the first and second pressures, the tab A of the member 42 is rotated with reference to the shaft 16 and the member 40 to pass the sensor head 26 at a preselected pressure. As indicated in the figure, the first preselected pressure is about 10 psi. That is, when the pointer 22 rotates to the 10 psi position the tab A will be positioned at the half diamond mark 45a and the encoded disc will transition from a reflecting surface to a non-reflecting surface. To select the second pressure, the tab B of the member 40 is positioned with reference to the graduation marks in inches of mercury. As illustrated in the figure, the tab B is set at approximately five (5) inches of mercury such that when the pointer 22 rotates past the 0 psi graduation mark to five inches of mercury that tab B will be positioned at the half diamond mark 45a. Again, the encoded disc 24 rotates from a reflecting surface to a non-reflecting surface.

Of course, this description of FIG. 4 is only one example of the operation of the apparatus of the present invention. The first pressure may be at a lower level than the second pressure depending on the operation of the gauge and the design of the reflecting and non-reflecting surfaces of the encoded disc 24.

As illustrated in FIG. 2, the fiber optic cables 28, 30, 32 and 34 are coupled to a controller 46 that includes circuitry for generating light to the fiber optic cables 28 and 30 and also circuitry for responding to light reflected from the encoded disc 24 to the fiber optic cables 32 and 34. As illustrated, the controller 46 includes a first preselected pressure indicator 48 and a second preselected pressure indicator 50. The controller 46 is located remote from the pressure gauge 10, thus removing the potential for electrical sparks generated at the pressure gauge which may be mounted in an explosive environment.

With the sensor head 26 mounted as explained and the encoded disc 24 rotatable on the shaft 16, as the shaft rotates, light will either be reflected to or blocked from the fiber optic cables 32 and 34. By sensing light transmitted through the fiber optic cables 32 and 34, selected pressures may be identified to actuate the indicators 48 and 50. For example, as the shaft 16 rotates the member 42 the non-reflective surface area 42a will be positioned in front of the light path from the fiber optic cable 30. This blocks light from reflecting to the fiber optic cable 34 which was previously reflected by the surface area 42b from the fiber optic cable 30. This establishes the first preselected pressure to actuate the indicator 48.

As the shaft 16 rotates in the reverse direction, the member 40 rotates the surface area 40b in front of the fiber optic cable 28 and the fiber optic cable 32. This causes light emitting from the fiber optic cable 28 to be blocked from reflecting back to the fiber optic cable 32. The controller 46 now responds to this non-reflected light condition to the cable 32 to actuate the indicator 50. This is the second preselected pressure which actuates the controller 46. The differential between the first preselected pressure and the second preselected pressure is variable by rotating the members 40 and 42 with reference to each other. The first and second preselected pressures are also variable by rotating the members 40 and 42 with reference to shaft 16. By this operation, the first preselected pressure is adjustable along with the second preselected pressure and the differential between these two pressures.

In addition to the advantage of removing the potential for electrical generated sparks at the pressure gauge 10, the apparatus of the present invention also has the advantage of mounting the encoded disc 24 on the shaft 16 which by means of the gear assembly 14 minimizes the effect on movement of the Bourdon tube 12. Mounting a mask at the end of the Bourdon tube, such as illustrated in U.S. Pat. No. 3,742,233, effects the accuracy of the instrument because the end of the Bourdon tube does not move linearly. These disadvantages are overcome by the mechanism of the present invention wherein the encoded disc 24 rotates with the shaft 16 and has only a minimum effect on the movement of the Bourdon tube 12.

Figure 5:
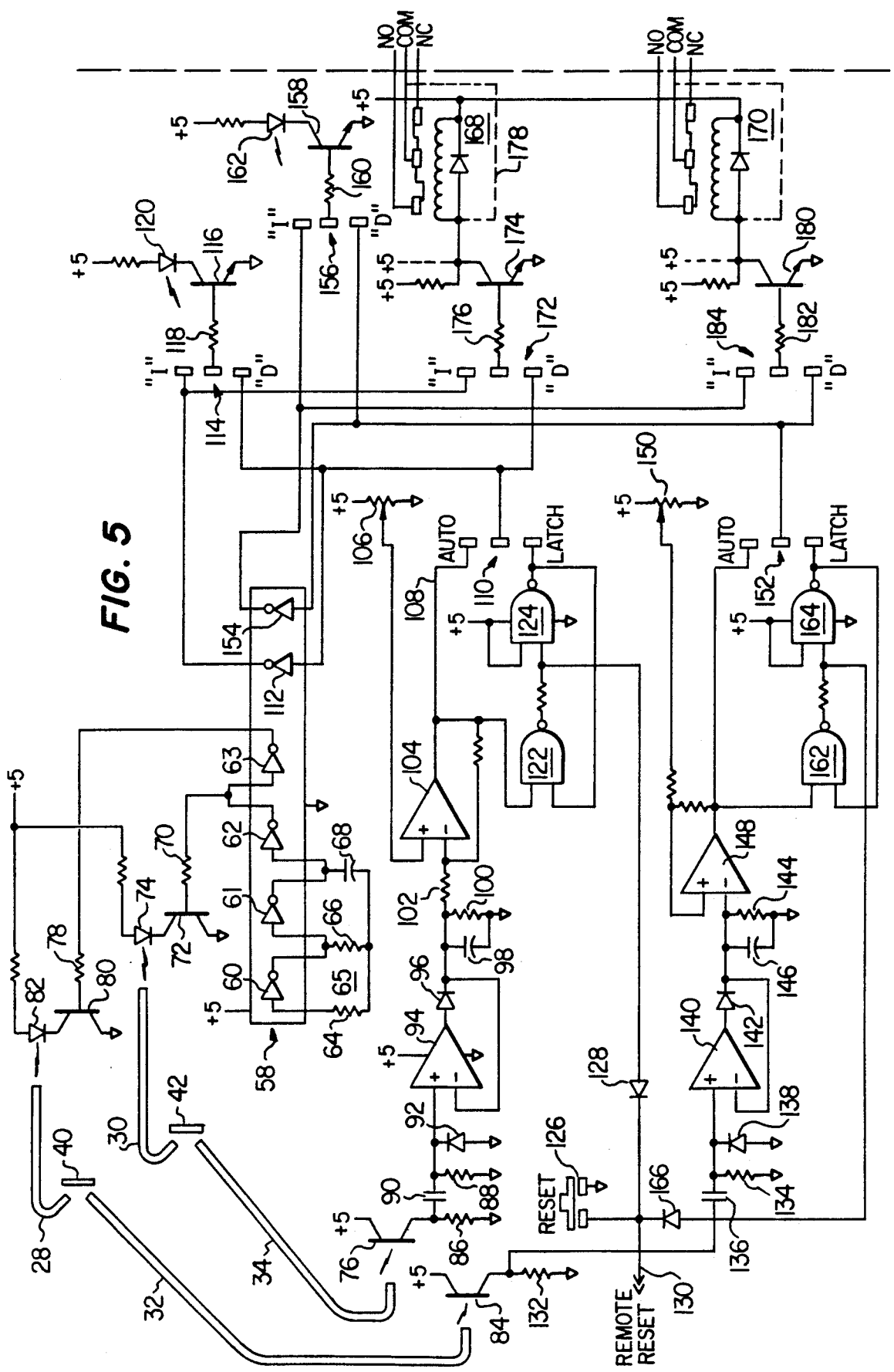
FIG. 5 is a schematic diagram of a control circuit for driving a light source and responding to the output of a light detector to generate pressure related indications and/or drive control signals.

Referring to FIG. 5, there is shown a schematic of a circuit for providing light to the sensor head 26 and also circuitry for responding to light reflected or not reflected from the sensor head to the controller 46.

In addition to the circuit for the controller 46 there is also illustrated in FIG. 5 the fiber optic cables 28, 30, 32 and 34 and a schematic representation of the members 40 and 42. The controller circuit has three basic components including a oscillator circuit 58, a first circuit for processing a first preselected pressure signal and a second circuit for processing a second preselected pressure signal. The oscillator circuit 58 includes four inverter amplifiers 60-63 and a resistor/capacitor feedback circuit 65 for establishing the frequency of operation. With reference to the feedback circuit 65, it includes resistors 64 and 66 and a capacitor 68. In one implementation of the oscillator 58, the amplifiers 60-63 were part of a 14049 chip with the resistance/capacitance network connected to the terminals as illustrated.

One output of the oscillator 58 is applied through a base resistor 70 to a driver transistor 72 for controlling a light emitting diode 74 as part of a first light source/light detector pair that includes a phototransistor 76. A second output from the oscillator 58 is generated at the output of the amplifier 63 and is the inverse of the output applied to the driver transistor 72. This second output of the oscillator is applied through a base resistor 78 to a driver transistor 80 for controlling a light emitting diode 82. The light emitting diode 82 is part of a second light source/light detector pair that includes a phototransistor 84. In one implementation of the circuit of FIG. 5, the light emitting diodes 74 and 82 emitted infrared radiation although it would be understood that visible radiation emitting diodes may be used.

Light from the diode 74 is transmitted through the fiber optic cable 30 to member 42 of the encoded disc 24 and selectively reflected therefrom by means of the fiber optic cable 34 to the phototransistor 76. Similarly, light emitted from the diode 82 is transmitted by the fiber optic cable 28 to the member 40 of the encoded disc 24 and selectively reflected therefrom by means of the fiber optic cable 32 to the phototransistor 84. Each of the phototransistors 76 and 84 when responding to light from the respective diode by means of the encoded disc 24 generates a signal periodically varying as the output of the oscillator 58. Thus, if the output of the oscillator 58 is a 300 Hz square wave, then the signal generated by each of the phototransistors 76 and 84 will also be a 300 Hz square wave.

Referring to that portion of the circuit of FIG. 5 responding to the first preselected pressure the phototransistor 76 is connected to an A.C. coupling network including resistor 88, a capacitor 90 and a diode 92. This network passes the 300 Hz square wave and filters out all steady state signals that might be generated by the phototransistor 76 as a result of extraneous light being picked up by the fiber optic cable 34 at the sensor head 26. Thus, only a time varying signal at the output of the phototransistor 76 will be passed through the A.C. coupling network. Signals passing through the network are applied to an amplifier 94 having an output connected through a diode 96 to an RC filter network consisting a capacitor 98 and a resistor 100. This RC network is designed to filter the output of the amplifier 94 to pass only a D.C. signal to the next amplifier stage for subsequent signal processing.

This subsequent signal processing includes an amplifier 104 connected to the RC filter network through a resistor 102. The amplifier 104 is connected as a differential amplifier having a second input connected to a biasing network including a set point resistor 106.

As the encoded disc 24 rotates on the shaft 16 to reflect light from the fiber optic cable 30 to the fiber optic cable 34, the phototransistor 76 generates a time varying signal at the same frequency as the output of the oscillator 58. This signal is applied to the amplifiers 94 and 104 to generate at the output of the latter a first pressure signal on a line 108. Line 108 connects to a two-position switch 110 that when positioned in the "auto" mode connects the output of the amplifier 104 to an inverter amplifier 112 and to a two-position switch 114. With the switch 114 set in the "D" position, the direct position, the output of the amplifier 104 is applied to an output driver 116 by means of a base resistor 118.

Connected to the collector electrode of the driver 116 is a light emitting diode 120 that is part of the indicator 48. Thus, when an output is generated by the amplifier 104 and the switch 110 is in the "auto" position and the switch 114 is in the "D" position, the indicator 48 is illuminated by means of the light emitting diode 120, thereby giving a first pressure indication.

In addition to a connection to the switch 110, the output of the amplifier 104 is also applied to a latch network including NAND gates 122 and 124 interconnected to hold a logic condition in response to the output of the amplifier 104. The output of the latch network at the NAND gate 124 is applied to the "latch" terminal of the switch 110. With the switch 110 in the "latch" position and the switch 114 in the "D" position the sensing of the first pressure by means by the encoded disc 24 sets the light emitting diode 120 to be continuously illuminated until the latch network is reset.

To reset the latch network, a reset switch 126 is connected through a diode 128 to the input of the NAND gate 124. With the switch 110 in the latch position, the low pressure indicator 48 remains illuminated until reset by operation of the reset switch 126. Also provided is a connection for remote reset by means of a line 130.

With the switch 114 in the "I" position, that is, the inverted position, the operation of the light emitting diode 120 is inverted from the previous explanation. That is, the light emitting diode 120 remains illuminated until the first pressure is identified by the encoded disc 24. This operation is effectuated by means of the inverter amplifier 112.

When the second preselected pressure is detected by the encoder disc 24, light from the diode 82 is transmitted through the fiber optic cable 28 and blocked by the member 40 so as not to be transmitted by means of the fiber optic cable 34 to the phototransistor 84. An output of the Phototransistor 84 is applied to an A.C. coupling network consisting of resistor 134, capacitor 136 and a diode 138. Operation of this coupling network is the same as the A.C. coupling network connected to the phototransistor 76. All steady state signals from the phototransistor 84 are blocked from input to an amplifier 140. This amplifier serves the same function as the amplifier 94 in the first pressure part of the circuitry of FIG. 5.

An output of the amplifier 140 is applied through a diode 142 to an RC filter network consisting of a resistor 144 and a capacitor 146. This RC filter network serves the same function as the RC network in the first pressure side of the circuit. By operation of the coupling network connected to the phototransistor 84 and the RC filter network at the output of the amplifier 140 only signals from the light emitting diode 82 as reflected from the member 40 are input to an amplifier 148. This amplifier is connected as a differential amplifier with the positive input terminal connected to a biasing control comprising a set point resistor 150. The resistor 150 sets the preselected second pressure, that is the second pressure sensed by the encoder disc 24.

The output of the amplifier 148 is applied to a switch 152 that is similar in operation to the switch 110. With the switch 152 in the "auto" position, an output of the amplifier 148 is applied to an inverting amplifier 154 and the "D" direct position of a switch 156. The switch 156 is similar in operation to the switch 114 and connects to an output driver 158 through a base resistor 160. The output driver 158 controls the operation of a light emitting diode 162 which is part of the pressure indicator 50 of FIG. 2.

In operation, when the second preselected pressure is detected at the encoded disc 24, the amplifier 148 generates an output that is applied through the switch 152 and the switch 156 to energize the light emitting diode 162 thereby giving an indication that the second preselected pressure has been identified. This energization of the light emitting diode 162 is maintained so long as the second preselected pressure is identified by the encoded disc 24.

Also included in the second pressure channel of the circuit of FIG. 5 is a latch network comprising a NAND gate 162 connected to a NAND gate 164. The output of the NAND gate 164 is connected to the "latch" terminal of the switch 152. This latch network for the high pressure side of the circuit functions identically to the latch network of the first pressure side. With the switch 152 set in the "latch" position, the light emitting diode 160 remains illuminated until the latch network has been reset. Resetting is a function of the reset push button 126 by a connection through a diode 166 to the input of the NAND gate 164.

By operation of the inverting amplifier 154 and with the switch 156 in the "I" invert position, the operation of the light emitting diode will be reversed from that as explained. This is the same function as performed by the inverting amplifier 112 and the switch 114.

Also included as a part of the circuit of FIG. 5 are control relays 168 and 170. These control relays provide downstream control functions operated by the apparatus of this invention. The control relay 168 responds to the first preselected pressure and the control relay 170 responds to the second preselected pressure.

Referring to the circuitry for the control relay 168, the output of the amplifier 104 is applied through the switch 110 to a switch 172 and through the switch 172 and a base resistor 176 to a control transistor 174. The switch 172 has an invert position "I" and a direct position "D" similar to the switch 114. By operation of the switch 172 and the control transistor 174, the control relay 168 operates in response to the same pressure conditions as the light emitting diode 120. With the switch 172 in the "D" position, direct response to the output of the amplifier 104 controls the relay 168. With the switch 172 in the "I" position, the relay 168 is controlled through the inverter amplifier 112.

As an alternative to use of the control relay 168, the collector electrode of the transistor 174 may be directly connected to the COM terminal. This is illustrated by the dotted line 178.

The control relay 170 is actuated from a control transistor 180 connected through a base resistor 182 and a switch 184 and the switch 152 to the output of the amplifier 148. The relay 170 operates in response to the same pressure conditions as the light emitting diode 162 in response to the second preselected pressure detected by the encoded disc 24. With the switch 184 in the direct "D" position, the transistor 180 is controlled directly from the output of the amplifier 148. With the switch 184 in the invert position "I", the transistor 180 is controlled through the inverter amplifier 154. Thus, operation of the control relay 170 is similar to operation of the light emitting diode 160 as previously explained.

The processing circuitry of FIG. 5 along with the fiber optic cables and the encoded disc 24 responds to first and second preselected pressures to provide visual indication of the selected pressures. Light received from the encoded disc 24 controls the operation of light emitting diodes as pressure indicators and also alternatively operates control relays for downstream control functions. The control circuitry is remotely mounted with reference to the pressure gauge 10 thereby eliminating the need for spark producing components at the pressure gauge.

The use of remote circuitry and fiber optic cables in conjunction with the encoded disc 24 advantageously provides apparatus for indicating preselected pressure levels with a minimum effect on the operation of the pressure gauge in its primary function of analog pressure indication.

It should be appreciated that although the above description has been directed to a condition responsive apparatus including a Bourdon tube pressure gauge, this description is not meant to be limiting. It is envisioned that the encoded disc of FIGS. 2 and 3 and its associated processing circuitry of FIG. 5 are useful in many condition responsive devices having a control member movable in response to a predetermined physical condition.

Although the invention is described in detail, it is to be clearly understood that the same is by way of illustration and example only and is not to be taken by way of limitation, the spirit and scope of the invention being limited only to the terms of the appended claims.

I claim:

1. A pressure responsive controller optically coupled to a pressure responsive device, comprising:
   a first light source/light detector pair,
   a second light source/light detector pair,
   a first fiber optic cable for transmitting light from the first light source to the pressure responsive device,
   a second fiber optic cable for transmitting light reflected at the pressure device from the light source to the light detector of the first pair,
   a third fiber optic cable for transmitting light from the light source of the second pair to the pressure responsive device,
   a fourth fiber optic cable for transmitting light reflected at the pressure device from the light source to the light detector of the second pair,
   an encoded disc movable in response to a pressure change at the pressure responsive device and having a first pattern to selectively reflect light from the light source to the light detector of the first pair and a different second pattern to selectively reflect light from the light source to the light detector of the second pair,
   a first control circuit connected to the light detector of the first pair and responsive to the output thereof only at a first adjustable preselected pressure to generate an indication of the first adjustable preselected pressure applied to the pressure responsive device, and
   a second control circuit connected to the light detector of the second pair and responsive to the output thereof only at a second adjustable preselected pressure to generate an indication of the second adjustable preselected pressure applied to the pressure responsive device.

2. A pressure responsive controller as set forth in claim 1 wherein the first and second patterns of said encoded disc are adjustable with reference to each other.

3. A pressure responsive controller as set forth in claim 1 wherein the first pattern establishes the first preselected pressure and the second pattern establishes the second preselected pressure as applied to the pressure responsive device.

4. A pressure responsive controller as set forth in claim 1 including an oscillator generating a periodically time varying output to activate the light source of said first and second pairs.

5. A pressure responsive controller as set forth in claim 4 wherein the first and second circuits each include an A.C. coupling network to limit the response thereof to the periodically varying output of said oscillator.

6. A pressure responsive controller comprising:
   a Bourdon tube operatively connected to rotate a shaft connected thereto in response to applied pressure,
   an encoded disc mounted to the shaft and rotatable therewith in response to pressure applied to the Bourdon tube and having a first pattern of light reflecting surfaces and light absorbing surfaces, and a second pattern of light reflecting surfaces and light absorbing surfaces,
   means for adjusting the position of the first disc pattern with respect to the position of the second disc pattern on said shaft to represent first and second preselected pressures, respectively,
   a first light source/light detector pair,
   a second light source/light detector pair,
   a first fiber optic cable for transmitting light from the first light source of the first pair to the first pattern of said encoded disc,
   a second fiber optic cable for transmitting light reflected from the first pattern of said disc to the light detector of said first pair,
   a third fiber optic cable for transmitting light from the light source of the second pair to the second pattern of said disc,
   a fourth fiber optic cable for transmitting light reflected from the second pattern of said disc to the light detector of the second pair,
   a first control circuit connected to the light detector of the first pair and responsive to the output thereof only at said first preselected adjustable pressure to generate an indication of the first adjustable preselected pressure applied to said Bourdon tube, and
   a second control circuit connected to the light detector of the second pair and responsive to the output thereof only at said second preselected adjustable pressure to generate an indication of the second adjustable preselected pressure applied to said Bourdon tube.

7. A pressure responsive controller as set forth in claim 6 wherein the first and second patterns of said encoded disc are adjustable with reference to each other.

8. A pressure responsive controller as set forth in claim 7 wherein said encoded disc is rotatable with reference to the shaft driven by said Bourdon tube to set the first and second preselected pressures.

9. A pressure responsive controller as set forth in claim 6 including an oscillator generating a periodically time varying output to activate the light source of said first and second pairs.

10. A pressure responsive controller as set forth in claim 9 wherein the first and second circuits each include an A.C. coupling network to limit the response thereof to the periodically varying output of said oscillator.

11. A pressure responsive controller as set forth in claim 6 wherein the first circuit includes a first light indicator actuated to give a visual signal of the first preselected pressure, and
   wherein the second circuit includes a second light indicator to give a visual signal of the second preselected pressure.

12. A pressure responsive controller as set forth in claim 11 wherein the first circuit includes a latch network to maintain the first light indicator actuated when the pressure applied to the Bourdon tube changes from the first preselected pressure, and
   wherein the second circuit includes a latch network to maintain the second light indicator actuated when the pressure applied to the Bourdon tube changes from the second preselected pressure.

13. A pressure responsive controller comprising:
- a Bourdon tube operatively connected to rotate a shaft connected thereto in response to applied pressure,
- an encoded disc coupled to the shaft and rotatable therewith in response to pressure applied to the Bourdon tube and having a first pattern of light reflecting surfaces and light absorbing surfaces adjustable with respect to a second pattern of light reflecting surfaces and light absorbing surfaces,
- a first light source/light detector pair,
- a second light source/light detector pair,
- a first fiber optic cable for transmitting light from the light source of the first pair to the first pattern of said encoded disc,
- a second fiber optic cable for transmitting light reflected from the first pattern of said disc to the light detector of said first pair,
- a third fiber optic cable for transmitting light from the second pattern of said encoded disc,
- a fourth fiber optic cable for transmitting light reflected from the second pattern of said disc to the light detector of the second pair,
- a first control circuit connected to the light detector of the first pair and responsive to the output thereof to generate an indication of a first preselected pressure applied to said Bourdon tube,
- an oscillator generating a periodically time varying output to activate the light source of the first and second pairs,
- a first control circuit connected to the light detector of the first pair and responsive to the output thereof at the periodically varying output rate of said oscillator to generate an indication of a first preselected pressure applied to said Bourdon tube, and
- a second control circuit connected to the light detector of the second pair and responsive to the output thereof at the periodically varying output rate of said oscillator to generate an indication of a second preselected pressure applied to the Bourdon tube.

14. A pressure responsive controller as set forth in claim 13 wherein said first control circuit includes a control relay operative at the first preselected pressure to generate an output of said first control circuit indicating the first preselected pressure, and
wherein the second control circuit includes a control relay responsive to the second preselected pressure to generate an output of the second control circuit indicating the second preselected pressure.

* * * * *